United States Patent
Choi

(10) Patent No.: US 9,692,192 B2
(45) Date of Patent: Jun. 27, 2017

(54) MULTI CONNECTOR, WIRING METHOD THEREOF AND DISPLAY APPARATUS HAVING THE SAME

(71) Applicant: Samsung Electronics Co., Ltd., Suwon-si (KR)

(72) Inventor: Sung-Il Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 275 days.

(21) Appl. No.: 14/339,790

(22) Filed: Jul. 24, 2014

(65) Prior Publication Data

US 2015/0146384 A1    May 28, 2015

(30) Foreign Application Priority Data

Nov. 26, 2013  (KR) .................. 10-2013-0144357

(51) Int. Cl.
  *H01R 24/60* (2011.01)
  *H01R 12/71* (2011.01)
  *H01R 43/00* (2006.01)
  *H05K 1/11* (2006.01)
  *H05K 5/00* (2006.01)
  (Continued)

(52) U.S. Cl.
  CPC ........... *H01R 24/60* (2013.01); *H01R 12/712* (2013.01); *H01R 12/716* (2013.01); *H01R 43/00* (2013.01); *H05K 1/11* (2013.01); *H05K 5/0017* (2013.01); *H05K 7/026* (2013.01); *H05K 7/1427* (2013.01);
  (Continued)

(58) Field of Classification Search
  USPC .................... 366/788; 439/78, 638
  See application file for complete search history.

(56) References Cited

U.S. PATENT DOCUMENTS 6,062,904 A   5/2000  Oguchi et al.
6,312,269 B1  11/2001 Obata
  (Continued)

FOREIGN PATENT DOCUMENTS

CN   102882066 A   1/2013
EP    0914697 A1   5/1999
  (Continued)

OTHER PUBLICATIONS

Communication issued on Mar. 19, 2015 by the European Patent Office in related Application No. 14190826.9.
  (Continued)

*Primary Examiner* — Andargie M Aychillhum
(74) *Attorney, Agent, or Firm* — Sughrue Mion, PLLC

(57) ABSTRACT

Disclosed are a multi connector, a wiring method thereof and a display apparatus having the same that is configured to use a common interface (CI) module for data communication between an electronic apparatus and an external apparatus or a plug used for an electronic connection of elements, regardless of standard conditions such as the number of terminals. The multi connector includes a body portion including a first slot portion and a second slot portion; a substrate portion including a substrate having a first surface; a plurality of first connection terminals provided on the first surface and extending to an inside of the first slot portion; and a plurality of second connection terminals provided on the first surface and extending to an inside of the second slot portion.

25 Claims, 12 Drawing Sheets

(51) Int. Cl.
*H05K 7/02* (2006.01)
*H05K 7/14* (2006.01)
*H01R 12/73* (2011.01)
*H01R 107/00* (2006.01)

(52) U.S. Cl.
CPC ........ *H01R 12/737* (2013.01); *H01R 2107/00* (2013.01); *Y10T 29/49222* (2015.01)

(56) References Cited

U.S. PATENT DOCUMENTS

| | | | |
|---|---|---|---|
| 6,835,100 B1 * | 12/2004 | Chen | H01R 13/2442 |
| | | | 439/630 |
| 2004/0023553 A1 * | 2/2004 | Lee | H01R 12/716 |
| | | | 439/541.5 |
| 2005/0159023 A1 | 7/2005 | Tanigawa et al. | |
| 2009/0137137 A1 * | 5/2009 | Jeong | H01R 29/00 |
| | | | 439/131 |

FOREIGN PATENT DOCUMENTS

| | | |
|---|---|---|
| JP | 5-54201 A | 3/1993 |
| KR | 10-0803141 B1 | 2/2008 |

OTHER PUBLICATIONS

Communication dated Apr. 21, 2017 issued by the European Patent Office in counterpart European Patent Application No. 14 190 826.9.

* cited by examiner

MULTI CONNECTOR, WIRING METHOD THEREOF AND DISPLAY APPARATUS HAVING THE SAME

CROSS-REFERENCE TO RELATED APPLICATION

This application claims priority from Korean Patent Application No. 10-2013-0144357, filed on Nov. 26, 2013 in the Korean Intellectual Property Office, the disclosure of which is incorporated herein by reference in its entirety.

BACKGROUND

Field

Apparatuses and methods consistent with the exemplary embodiments relate to a multi connector that is used for electronic apparatuses such as a television (TV), a personal computer (PC) and a laptop computer, and more particularly, to a multi connector, a wiring method thereof and a display apparatus having the same that is configured to use a common interface (CI) module for data communication between an electronic apparatus and an external apparatus or a plug used for an electronic connection of elements, regardless of standard conditions such as the number of terminals.

Description of the Related Art

In general, an electronic apparatus such as a TV, a PC and a laptop computer includes a connector that performs data communication with an external apparatus through a CI module that is electrically connected to elements such as a power source through a plug.

Such a connector may be designed to be installed in combination with CI modules or plugs having a different number of connection terminals in a common main printed circuit board (PCB) depending on a model of the electronic apparatuses, to reduce manufacturing costs of the electronic apparatuses.

For example, the connector may include a plurality of individual connectors, e.g., a first connector including 64 pins and a second connector including 132 pins, corresponding to the CI modules or plugs that are optionally installed in the main PCB.

To install the first and second connectors in the main PCB, an installation space for first and second installation sockets is needed. Such an installation space may increase the size of the main PCB, resulting in a failure to make the electronic apparatus smaller, and further resulting in an increase in the manufacturing costs.

The first and second connectors may need expensive substrates for electrically connecting the CI modules or plugs to the first and second installation sockets, respectively. Accordingly, the number of components of the connectors increases, and the manufacturing costs also rise.

Since the first and second connectors are formed, an external back cover that covers the main PCB should be provided separately for the first connector and the second connector. To achieve such a design, if the external back cover is designed as a single element for covering the main PCB to install both the first and second connectors, the external back cover is enlarged and takes up more space. As a result, the downsizing of the electronic apparatus may be more difficult.

SUMMARY

Accordingly, one or more exemplary embodiments may provide a multi connector, a wiring method thereof and a display apparatus having the same, which are configured to use CI modules or plugs for an electronic apparatus such as a TV, a PC and a laptop computer, regardless of standard conditions such as the number of terminals.

Another exemplary embodiment may provide a multi connector, a wiring method thereof and a display apparatus having the same, which are configured to take up less installation space than conventional models, to enable CI modules or plugs to be easily detached, and to decrease the number of used components to thereby reduce manufacturing costs.

According to an aspect of an exemplary embodiment, the foregoing and/or other aspects may be achieved by providing a multi connector including: a body portion comprising a first slot portion and a second slot portion; a substrate portion comprising a substrate having a first surface; a plurality of first connection terminals provided on the first surface and extending to an inside of the first slot portion; and a plurality of second connection terminals provided on the first surface and extending to an inside of the second slot portion.

The second slot portion may be provided above the first slot portion. The second slot portion may form a step in the form of a staircase, together with the first slot portion.

The first and second connection terminals may include protruding pins, respectively.

The first connection terminals may be longer in length than the second connection terminals.

The first and second connection terminals may be provided in different quantities. Particularly, the first connection terminals may be fewer in number than the second connection terminals.

The substrate portion may further include a printed circuit board (PCB).

The substrate portion may further include a pin portion configured to be formed in the substrate and to be coupled to an installation socket portion of a main substrate of an electronic apparatus. The pin portion may include a plurality of first contact points configured to be jointly connected to the plurality of first connection terminals and a part of the plurality of second connection terminals through a plurality of first wirings, and a plurality of second and third contact points configured to be connected to a remainder of the plurality of second connection terminals other than the part of the plurality of second connection terminals through a plurality of second wirings.

The first and second contact points may be provided in parallel with the first and second connection terminals.

In addition, the first contact points may be provided on a central portion of a surface of the pin portion, the second and third contact points may be provided on opposite ends of the central portion of the surface, and the plurality of first and second wirings may be formed in a crossed fashion on the substrate.

Alternatively, the first contact points may be provided on a first side of a surface of the pin portion, the second and third contact points may be provided on a second side of the surface of the pin portion, and the plurality of first and second wirings may be formed in a crossed fashion on the substrate.

Also, the first contact points may be provided on a first surface of the pin portion, and the second and third contact points may be provided on a second surface of the pin portion.

According to another aspect of an exemplary embodiment, there is provided a multi connector including: a body portion comprising a first slot portion and a second slot portion; and a substrate portion comprising a substrate comprising a plurality of first connection terminals extending to an inside of the first slot portion and a plurality of second connection terminals extending to an inside of the second slot portion, and a pin portion configured to be formed on the substrate and comprising a plurality of first contact points jointly connected to the plurality of first connection terminals and a part of the plurality of second connection terminals and a plurality of second and third contact points connected to a remainder of the plurality of second connection terminals other than the part of the plurality of second connection terminals.

The multi connector may further include a plurality of first wirings configured to jointly connect the plurality of first connection terminals and the part of the plurality of second connection terminals to the plurality of first contact points, and a plurality of second wirings configured to connect the remainder of the plurality of second connection terminals to the plurality of second and third contact points.

The first contact points may be provided on a central portion of a surface of the pin portion, the second and third contact points may be provided on opposite ends of the central portion of the surface, and the plurality of first and second wirings may be formed in a crossed fashion on the substrate.

Alternatively, the first contact points may be provided on a first side of a surface of the pin portion, the second and third contact points may be provided on a second side of the surface of the pin portion, and the plurality of first and second wirings may be formed in a crossed fashion on the substrate.

Also, the first contact points may be provided on a first surface of the pin portion, and the second and third contact points may be provided on a second surface of the pin portion.

According to another aspect of an exemplary embodiment, there is provided a wiring method of a multi connector including a body portion including a first slot portion and a second slot portion; and a substrate portion comprising a substrate comprising a plurality of first connection terminals extending to an inside of the first slot portion and a plurality of second connection terminals extending to an inside of the second slot portion and a pin portion configured to be formed in the substrate and comprising a plurality of first contact points, a plurality of second contact points, and a plurality of third contact points, the wiring method including: jointly connecting the plurality of first connection terminals and a part of the plurality of second connection terminals to the plurality of first contact points; and connecting the plurality of second and third contact points to a remainder of the plurality of second connection terminals other than the part of the plurality of second connection terminals.

The jointly connecting may further include providing the first contact points on a central portion of a surface of the pin portion, and the connecting may further include providing the second and third contact points on opposite ends of the central portion of the surface of the pin portion.

Alternatively, the jointly connecting may further include providing the first contact points on a first side of a surface of the pin portion, and the connecting may further include providing the second and third contact points on a second side of the surface of the pin portion.

Also, the jointly connecting may further include providing the first contact points on a first surface of the pin portion, and the connecting may further include providing the second and third contact points on a second surface of the pin portion.

According to another aspect of an exemplary embodiment, there may be provided a display apparatus including: a chassis; a main substrate configured to be installed on the chassis and comprising an installation socket portion; and a multi connector configured to be coupled to the installation socket portion and to jointly install a plurality of common interface (CI) modules therein, wherein the multi connector comprises a body portion comprising a first slot portion and a second slot portion, and a substrate portion comprising a substrate comprising a first surface on which a plurality of first connection terminals extending to an inside of the first slot portion is provided and a plurality of second connection terminals extending to an inside of the second slot portion is provided.

The multi connector may be configured to be exposed to the outside when the main substrate is sealed by a sealing cover.

The plurality of CI modules may include a plurality of smart cards respectively comprising different numbers of terminals.

BRIEF DESCRIPTION OF THE DRAWINGS

The above and/or other aspects will become apparent and more readily appreciated from the following description of the exemplary embodiments, taken in conjunction with the accompanying drawings, in which.

DETAILED DESCRIPTION OF EXEMPLARY EMBODIMENTS

Figure 1:
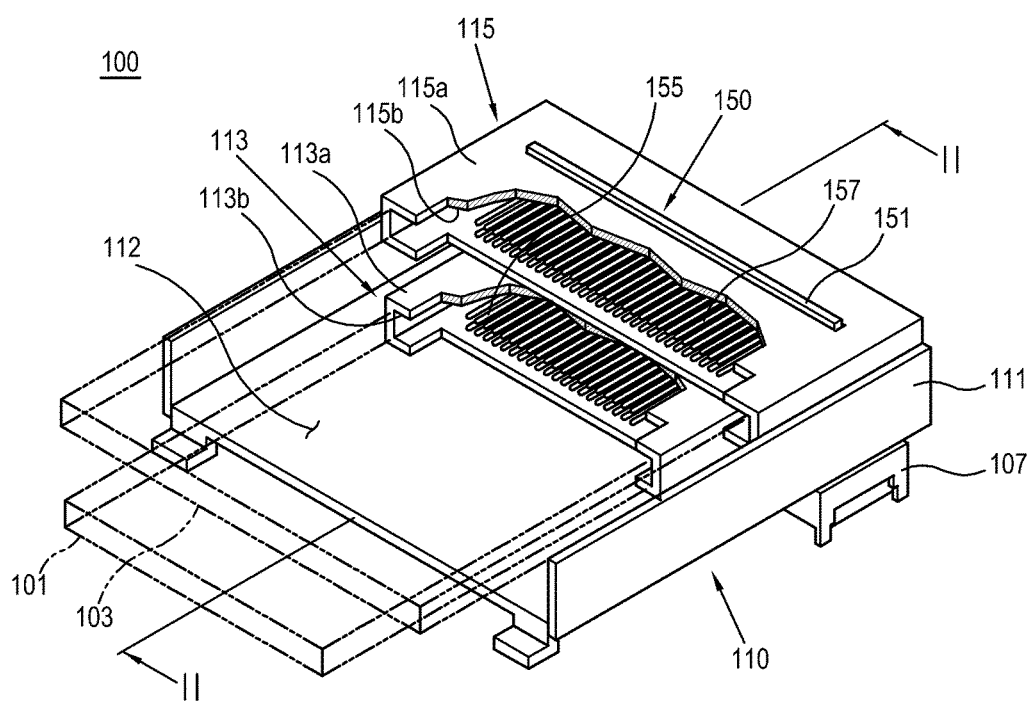
FIG. 1 is a partial sectional perspective view of a multi connector according to an exemplary embodiment.

Below, exemplary embodiments will be described in detail with reference to accompanying drawings so as to be easily realized by a person having ordinary skill in the art. The exemplary embodiments may be embodied in various forms without being limited to the exemplary embodiments set forth herein. Descriptions of well-known parts are omitted for clarity, and like reference numerals refer to like elements throughout.

Hereinafter, a multi connector, a wiring method thereof and a display apparatus having the same according to exemplary embodiments will be described in detail with reference to accompanying drawings.

Figure 2:
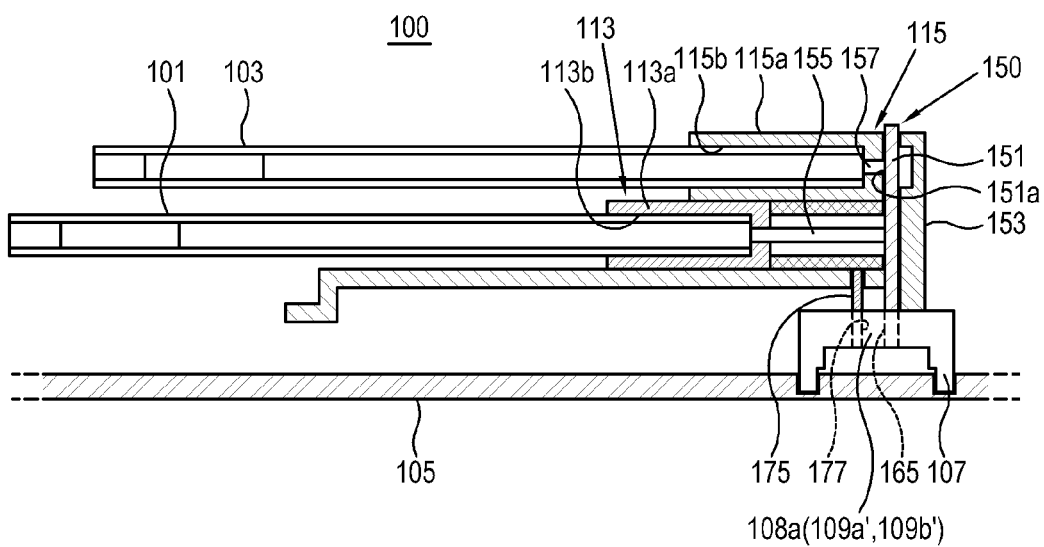
FIG. 2 is a partial sectional view of the multi connector, taken along the line II-II in FIG. 1.

FIG. 1 is a partial sectional perspective view of a multi connector according to an exemplary embodiment. FIG. 2 is a partial sectional view of the multi connector, taken along the line II-II in FIG. 1.

The multi connector 100 according to an exemplary embodiment is used for an electronic apparatus such as a TV, a PC and a laptop computer, and may be applied to enable the joint use of a plurality of common interface (CI) modules such as smart cards, common public radio interface (CPRI) or PCMCIA cards, or plugs, which have a different number of connection terminals.

Hereinafter, the multi connector 100 according to an exemplary embodiment will be exemplarily described as a multi connector that jointly uses a plurality of CI modules such as smart cards for descrambling scrambled broadcasting signals and that may be applied to a display apparatus 200 (refer to FIGS. 8 and 9) such as a TV.

As shown in FIGS. 1 and 2, the multi connector 100 according to an exemplary embodiment includes a body portion 110 and a substrate portion 150.

The body portion 110 accommodates and supports a plurality of CI modules 101 and 103 when the plurality of CI modules 101 and 103 is connected to the multi connector 100, and includes a supporting body portion 111 and a plurality of slot portions 113 and 115.

The plurality of CI modules 101 and 103 may also be referred to as first and second CI modules 101 and 103, and the plurality of slot portions 113 and 115 may also be referred to as first and second slot portions 113 and 115.

The first CI module 101 may be a CI card that satisfies a first CI standard and that includes first connection terminals or first connection terminal sockets (not shown) (hereinafter, also referred to as a 'connection terminal socket') such as 64 pins, and the second CI module 103 may be a CI card that satisfies a second CI standard and that includes 132 second connection terminal sockets (not shown).

The supporting body portion 111 is shaped like a rectangular parallelepiped including an installation space 112 that has open upper and front portions (see FIG. 1) and that accommodates first and second CI modules 101 and 103 therein and has first and second slot portions 113 and 115 installed therein.

The first and second slot portions 113 and 115 are installed in a rear side of the installation space 112.

The first slot portion 113 accommodates and supports a front end portion of the first CI module 101 when the first CI module 101 is inserted into the open front portion of the installation space 112, and is provided on a bottom surface of the supporting body portion 111 in the rear side of the installation space 112. The first slot portion 113 includes a first rectangular parallelepiped-shaped hollow portion 113a having an open front portion and in which a slot 113b is formed. The first rectangular parallelepiped-shaped hollow portion 113a has a width corresponding to a width of the first CI module 101 to accommodate the front end portion of the first CI module 101 when the first CI module 101 is inserted thereinto.

The second slot portion 115 accommodates and supports a front end portion of the second CI module 103 when the second CI module 103 is inserted into the open front portion of the installation space 112, and is provided above the first rectangular parallelepiped-shaped hollow portion 113a of the first slot portion 113 in the rear side of the installation surface 112 of the supporting body portion 111. Similar to the first slot portion 113, the second slot portion 115 includes a second rectangular parallelepiped-shaped hollow portion 115a having an open front portion and in which a slot 115b is formed. The second rectangular parallelepiped-shaped hollow portion 115a has a width corresponding to a width of the second CI module 103 to accommodate the front end portion of the second CI module 103 when the second CI module 103 is inserted therein. That is, as the width of the second CI module 103 is wider than the first CI module 101, the second rectangular parallelepiped-shaped hollow portion 115a has a wider width than a width of the first rectangular parallelepiped-shaped hollow portion 113a of the first slot portion 113.

The second rectangular parallelepiped-shaped hollow portion 115a is provided more behind a front part (left-side in FIG. 1) of the installation space 112 than the first rectangular parallelepiped-shaped hollow portion 113a, and is provided above the first rectangular parallelepiped-shaped hollow portion 113a to form a staircase-shaped step together with the first rectangular parallelepiped-shaped hollow portion 113a.

As the second slot portion 115 for accommodating and supporting the front end portion of the second CI module 103 is provided above the first slot portion 113 for accommodating and supporting the front end portion of the first CI module 101, an installation space for the first and second CI modules 101 and 103 may be significantly smaller than the conventional case where the first and second CI modules 101 and 103 are installed through individual connectors. As a result, the main substrate 105 of the display apparatus 200 is reduced in size, and accordingly, manufacturing costs of the display apparatus 200 may be reduced.

The substrate portion 150 is used to electrically connect first and second connection terminal sockets of the first and second CI modules 101 and 103 to an installation socket 107 formed in the main substrate 105 of the display apparatus 200. The substrate portion 150 includes a substrate 151 and a pin portion 165 formed below the substrate 151. The main substrate 105 may include a printed circuit board (PCB).

As shown in FIG. 2, the substrate 151 is vertically attached to an installation bracket 153 installed in a rear side of the supporting body portion 111, and has a plurality of first and second connection terminals 155 and 157 formed on a front surface 151a thereof.

The first and second connection terminals 155 and 157 may be implemented as protruding pins corresponding to the first and second connection terminal sockets of the first and second CI modules 101 and 103, respectively.

The first and second connection terminals 155 and 157 are inserted into the first and second connection terminal sockets of the first and second CI modules 101 and 103 when the first and second CI modules 101 and 103 are connected to the multi connector 100. As a result, the substrate 151 is electrically connected to the first and second CI modules 101 and 103.

The first connection terminals 155 extend from the front surface 151a of the substrate 151 to an inside of the first rectangular parallelepiped-shaped hollow portion 113a of the first slot portion 113. The second connection terminals 157 extend from the front surface 151a of the substrate 151 to an inside of the second rectangular parallelepiped-shaped hollow portion 115a of the second slot portion 115. Since the first rectangular parallelepiped-shaped hollow portion 113a is provided to extend closer to the front part of the installation space 112 than the second rectangular parallelepiped-shaped hollow portion 115a in the installation space 112 of the supporting body portion 111, the first connection terminals 155 extend to have a longer length from the front surface 151a of the substrate 151 than the second connection terminals 157.

Since the first and second connection terminals 155 and 157 that are inserted into the first and second connection terminal sockets of the first and second CI modules 101 and 103 are formed on the front surface 151a of the substrate 151, the substrate 151 may be formed as a single body. As a result, manufacturing costs may be reduced compared to the conventional case where the first and second connection terminals 155 and 157 are provided in individual substrates, respectively, for the first and second CI modules 101 and 103.

Figure 3:
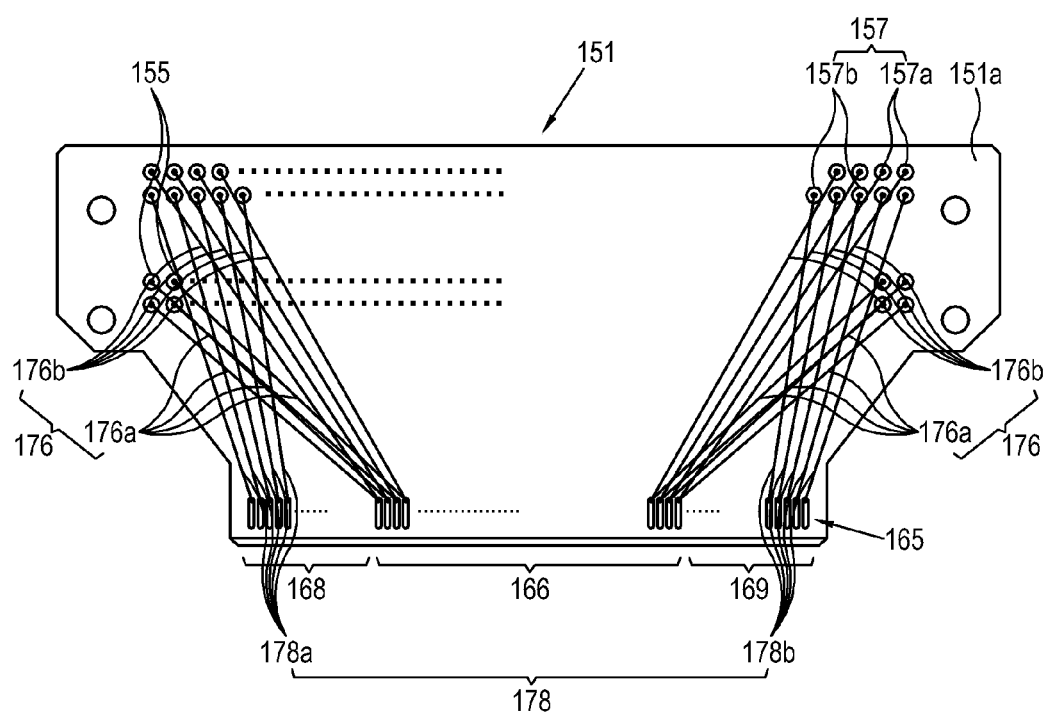
FIG. 3 illustrates a front surface of a substrate of the multi connector as shown in FIG. 1.

As shown in FIG. 3, the first and second connection terminals 155 and 157 are provided in plural lines and columns. For example, the first connection terminals 155 may be formed in 2×32 units (horizontal (line)×vertical (column)) corresponding to 64 first connection terminal sockets according to the first CI standard of the first CI module 101, and the second connection terminals 157 may be formed in 2×66 units (horizontal×vertical) corresponding to 132 second connection terminal sockets according to the second CI standard of the second CI module 103.

If the multi connector 100 is used as a connector according to the first CI standard, the first CI module 101 that satisfies the first CI standard may be inserted into the first rectangular parallelepiped-shaped hollow portion 113a of the first slot portion 113 to couple the first connection terminal sockets of the first CI module 101 with the first connection terminals 155 of the substrate 151. If the multi connector 100 is used as a connector according to the second CI standard, the second CI module 103 that satisfies the second CI standard may be inserted into the second rectangular parallelepiped-shaped hollow portion 115a of the second slot portion 115 to couple the second connection terminal sockets of the second CI module 103 with the second connection terminals 157 of the substrate 151.

Figure 4:
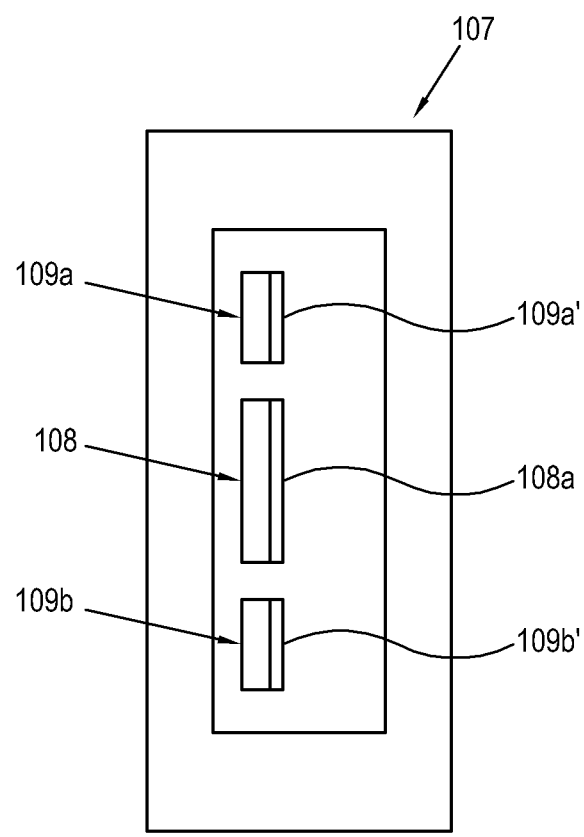
FIG. 4 is a plan view of an installation socket portion of a main substrate of a display apparatus in which the multi connector shown in FIG. 1 is installed.

As shown in FIG. 4, the pin portion 165 is coupled to first to third installation sockets 108, 109a and 109b of the installation socket portion 107 when the multi connector 100 is installed on the main substrate 105 of the display apparatus 200.

The pin portion 165 includes a plurality of first contact points 166, and a plurality of second and third contact points 168 and 169. The first contact points 166 is jointly connected to the plurality of first connection terminals 155 and a part 157a of the plurality of second connection terminals 157 through a plurality of first wirings 176, and the second and third contact points 168 and 169 are connected to a remainder 157b of the plurality of second connection terminals 157 through a plurality of second wirings 178.

Hereinafter, wirings between the first to third contact points 166, 168 and 169 and the first and second connection terminals 155 and 157 will be described in more detail with reference to FIGS. 3 and 7.

Figure 7:
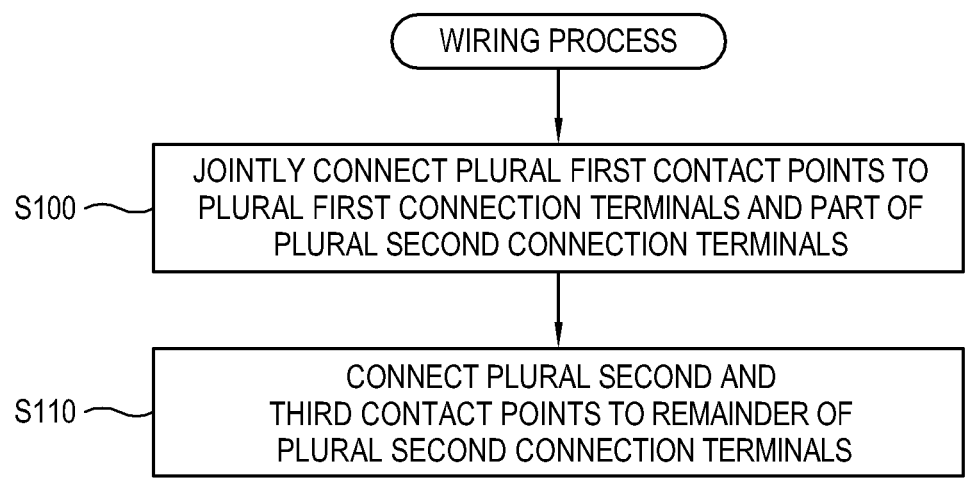
FIG. 7 is a flowchart showing a wiring method for first and second connection terminals and first to third contact points of a pin portion of the substrate of the multi connector according to an exemplary embodiment.

The plurality of first contact points 166 includes 64 units corresponding to the 64 first connection terminal sockets according to the first CI standard of the first CI module 101, and is jointly connected to 64 first connection terminals 155 and a part 157a of the second connection terminals 157, e.g., the top 64 second connection terminals 157a through 64 first and second sub wirings 176a and 176b of the first wiring 176 at operation S100 (FIG. 7).

The first and second sub wirings 176a and 176b may be provided in a front surface 151a of the substrate 151. Alternatively, to make a wiring design easier, the first sub wiring 176a may be formed in the front surface 151a of the substrate 151, and the second sub wiring 176b may be formed in a rear surface of the substrate 151.

The first contact points 166 are provided in parallel with the first and second connection terminals 155 and 157 at a central portion of a front surface of the pin portion 165.

The first contact points 166 make contact with, and are electrically connected to, first counter contact points 108a of the first installation socket 108 when the multi connector 100 is installed in the installation socket portion 107 of the main substrate 105.

The plurality of second and third contact points 168 and 169 include 68 units to form 132 contact points corresponding to the 132 connection terminal sockets according to the second CI standard of the second CI module 103, together with the 64 first contact points 166, and is connected to the bottom 68 second connection terminals 157b as the remainder 157b of the second connection terminals 157 through 68 third and fourth sub wirings 178a and 178b of 68 second wirings 178 at operation S110.

The third and fourth sub wirings 178a and 178b may be provided in the front surface 151a of the substrate 151. Alternatively, to make the wiring design easier, a part of the third and fourth sub wirings 178a and 178b may be formed in the front surface 151a of the substrate 151, and the remainder of the third and fourth sub wirings 178a and 178b may be formed in a rear surface of the substrate 151.

Each of the 34 units of the second and third contact points 168 and 169 are provided at opposite ends of a central portion of the front surface of the pin portion 165 to form, in a crossed fashion, the plurality of first and second wirings 176 and 178 in the substrate 151. Similar to the first contact points 166, the second and third contact points 168 and 169 are provided in parallel with the first and second connection terminals 155 and 157.

The second and third contact points 168 and 169 make contact with, and are electrically connected to, second and third counter contact points 109a' and 109b' of the second and third installation sockets 109a and 109b when the multi connector 100 is installed in the installation socket portion 107 of the main substrate 105.

The substrate 151 in which the first to third contact points 166, 168 and 169 are formed may be implemented as a PCB, although is not limited thereto.

The pin portion 165 is guided by an insertion guide 175 to be inserted into the first to third installation sockets 108, 109a and 109b of the installation socket portion 107. As shown in FIG. 2, the insertion guide 175 may be shaped like a rectangular column to cover the pin portion 165 except for a front surface thereof from a lower side of the supporting body portion 111. The insertion guide 175 may include a supporting groove 177 to accommodate and support counter pin portions 108a, 109a' and 109b' of the first to third installation sockets 108, 109a and 109b, corresponding to the front surface of the pin portion 165.

Figure 8:
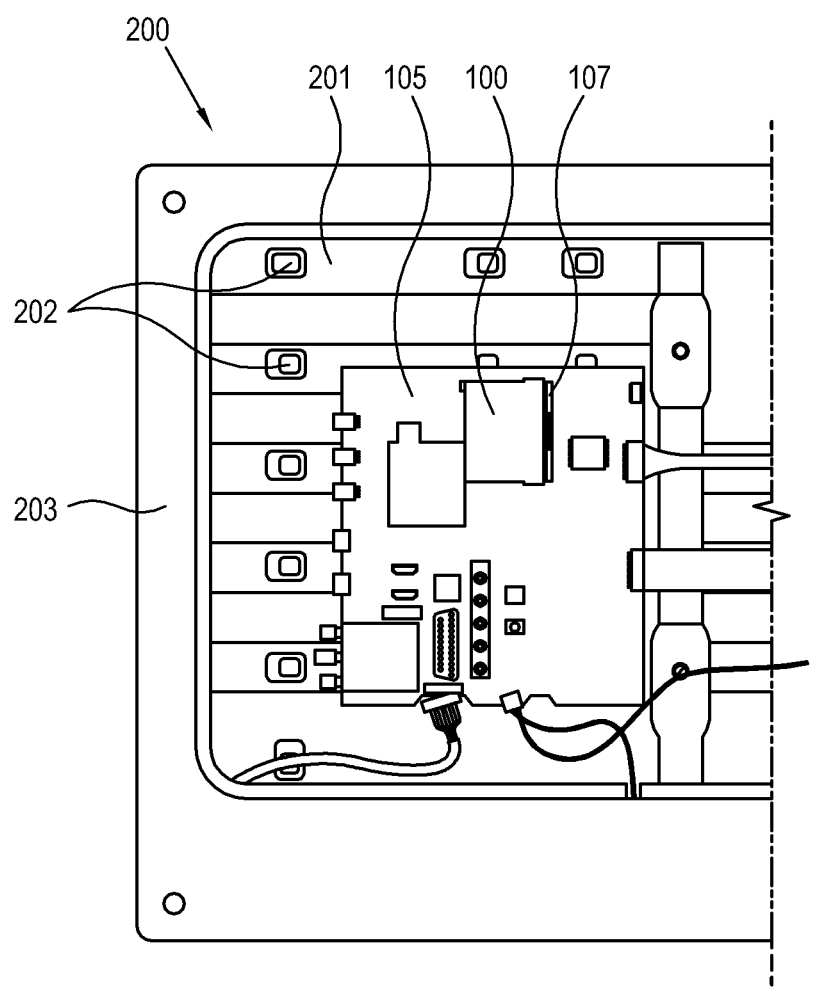
FIG. 8 is a plan view showing the multi connector installed on the main substrate that is installed on a bottom chassis in the display apparatus that is upside down.
Figure 9:
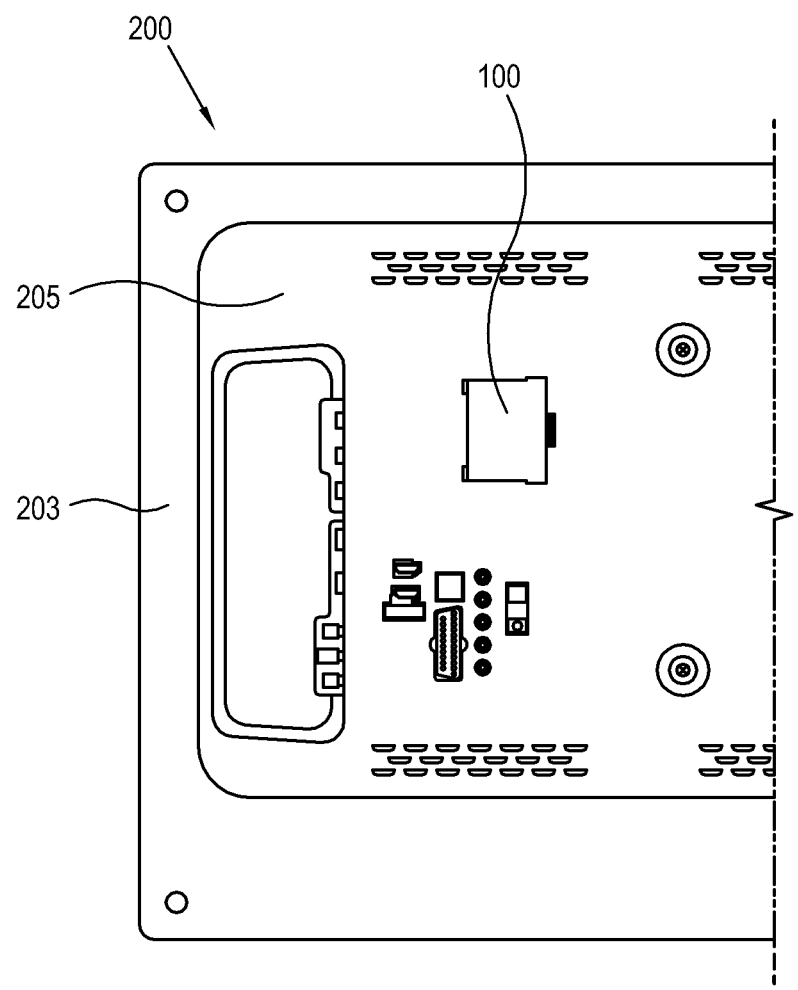
FIG. 9 is a plan view of the display apparatus in FIG. 8 in which a sealing cover sealing the main substrate is coupled to an external chassis to expose the multi connector to the outside.

FIG. 8 illustrates the display apparatus 200 in which the multi connector 100 according to an embodiment is installed, and specifically illustrates an example of the main substrate 105 that is installed on a bottom chassis 201. FIG. 9 illustrates the display apparatus 200 shown in FIG. 8 in which a sealing cover 205 sealing the main substrate 105 is coupled to an external cover 203 to expose the multi connector 100 to the outside.

As shown in FIG. 8, the multi connector 100 is coupled to the installation socket portion 107 of the main substrate 105 provided on the bottom chassis 201 that supports a rear surface 202 of a display panel of the display apparatus 200.

As shown in FIG. 9, the multi connector 100 is installed to be exposed to the outside when the sealing cover 205 sealing the main substrate 105 is coupled to the external cover 203. According to the main substrate 105 used for the display apparatus 200, the first CI module 101 or the second CI module 103 may be connected to the multi connector 100 from the outside of the display apparatus 200. The first and second CI modules 101 and 103 may include smart cards including 64 and 132 connection terminal sockets, respectively, and may descramble scrambled broadcasting signals as provided by a broadcasting business operator.

The multi connector 100 according to an exemplary embodiment has been exemplified and explained as being used to commonly use the plurality of CI modules 101 and 103. As explained above, the multi connector 100 may be used to commonly use a plurality of plugs with the same configuration and according to the same principle.

The multi connector 100 according to an exemplary embodiment has been exemplified and explained as including two slot portions 113 and 115 for the body portion 110 to accommodate and support the two CI modules 101 and 103. However, depending on design, the multi connector 100 may further include third to nth slot portions to accommodate and support third to Nth CI modules that satisfy third to Nth CI standards, in addition to the two CI modules 101 and 103.

The multi connector 100 according to an exemplary embodiment has been exemplified and explained as having a configuration in which the first slot portion 113 in which the first CI module 101 is installed is provided below the second slot portion 115 in which the second CI module 102 is installed, but other exemplary embodiments are not limited thereto. Alternatively, depending on design, the first and second slot portions 113 and 115 may be provided vice versa. In such a case, the locations of the first and second connection terminals 155 and 157 and the locations of the first and second wirings 176 and 178 of the pin portion 165 may be correspondingly changed.

The multi connector 100 according to an exemplary embodiment has been exemplified and explained as having a configuration in which the first contact points 166 of the pin portion 165 are provided in the central portion of the front surface of the pin portion 165, and the second contact points 168 and 169 are respectively provided on the opposite sides of the front surface of the pin portion 165, but other exemplary embodiments are not limited thereto.

Figure 5A:
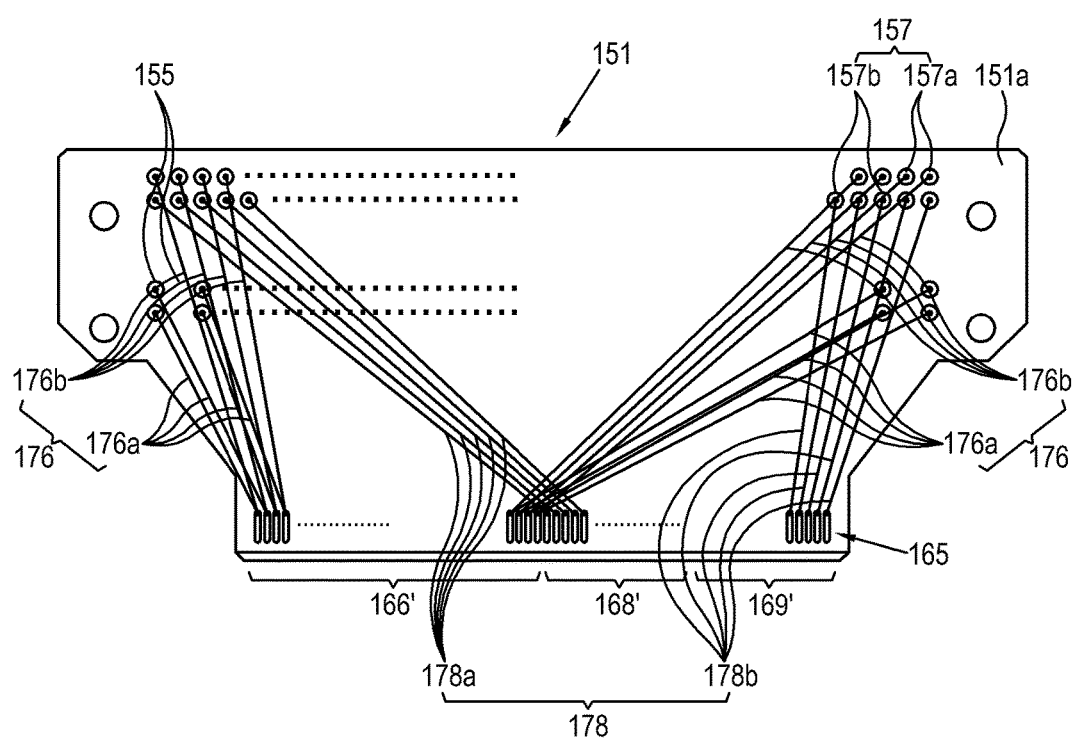
FIGS. 5A and 5B illustrate modification examples of the substrate shown in FIG. 3 and the installation socket portion of the main substrate corresponding to the substrate, respectively.
Figure 5B:
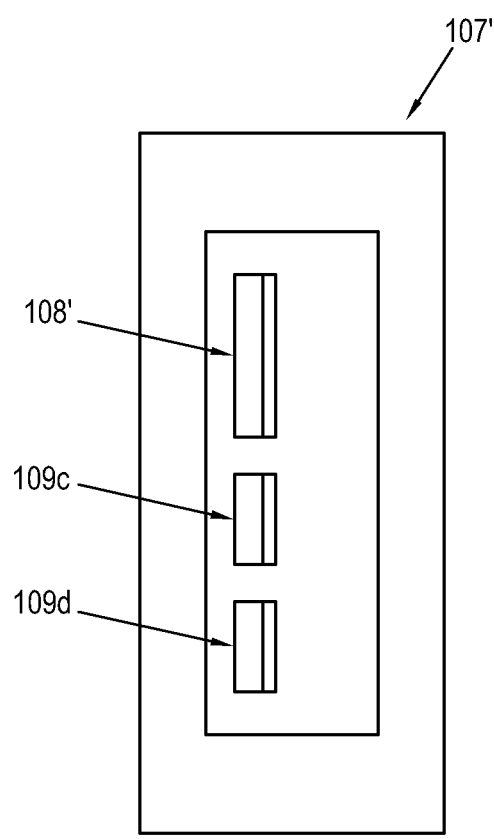

For example, as shown in FIG. 5A, first contact points 166' may be provided on a first side of a front surface of a pin portion 165', and second contact points 168' and 169' may be provided on a second side of a front surface of the pin portion 165'. In such a case, as shown in FIG. 5B, first, second and third installation sockets 108', 109c and 109d of an installation socket portion 107' of the main substrate 105 are correspondingly changed.

Figure 6A:
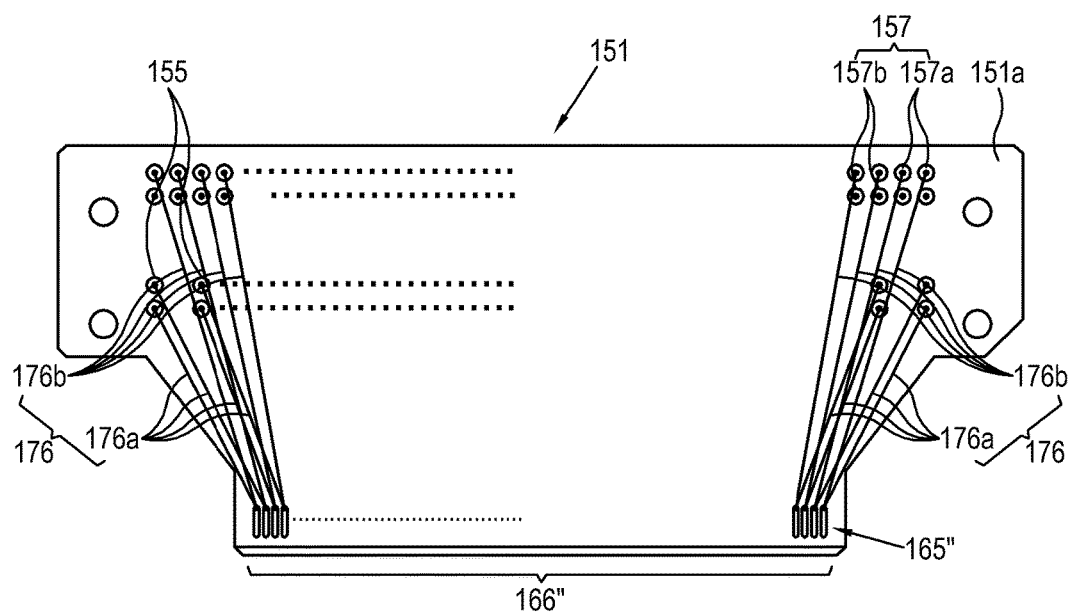
FIGS. 6A to 6C illustrate modification examples of front and rear surfaces of the substrate shown in FIG. 3 and the installation socket portion of the main substrate corresponding to the substrate, respectively.
Figure 6B:
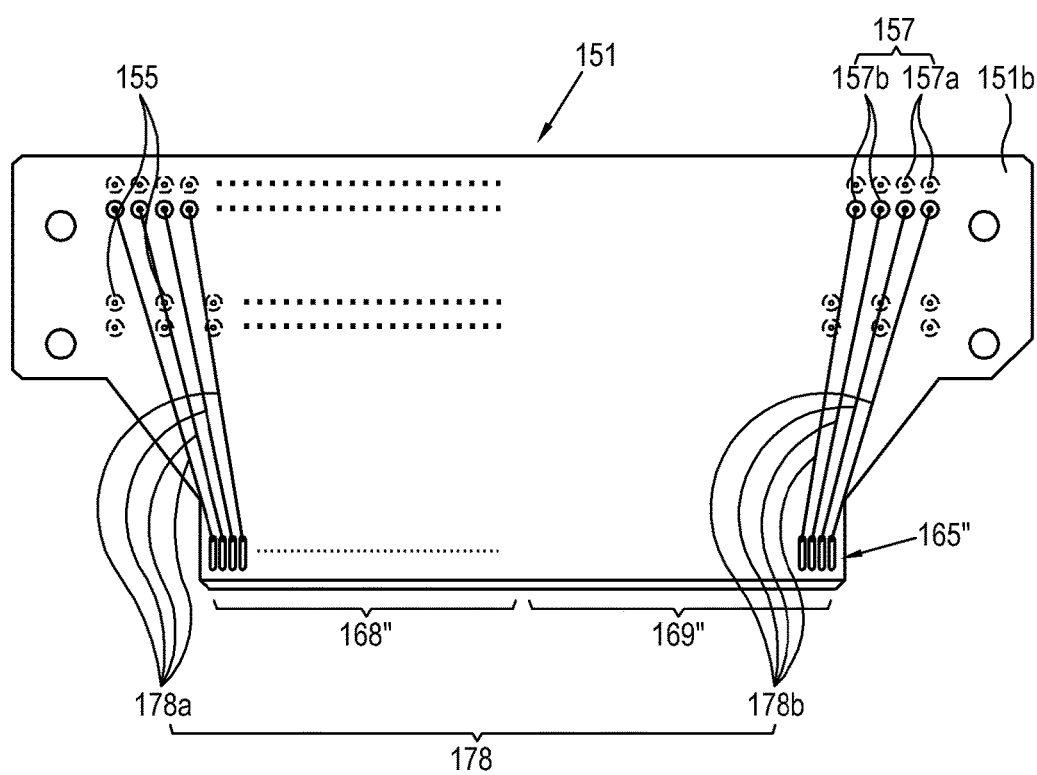
Figure 6C:
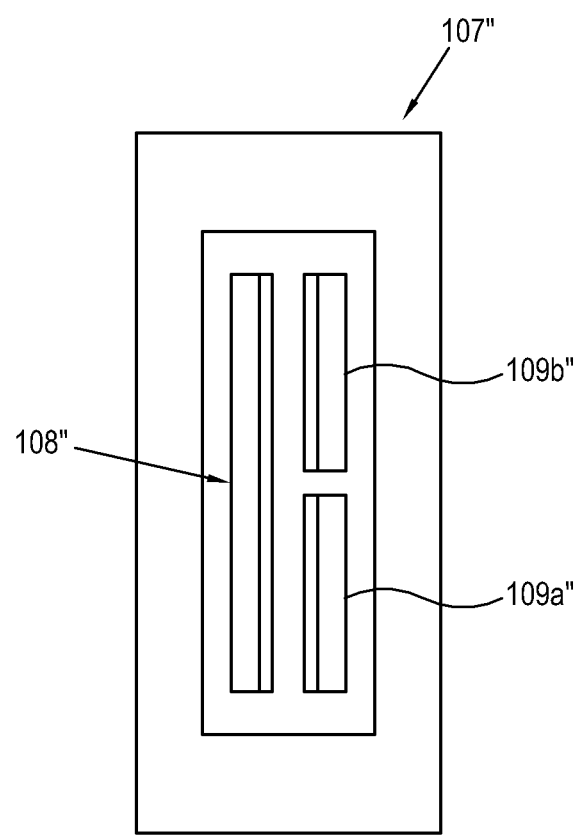

As shown in FIGS. 6A and 6B, first contact points 166" may be provided on a front surface 151a of a pin portion 165", and second contact points 168" and 169" may be provided on a rear surface 151b of the pin portion 165". As shown in FIG. 6C, first and second installation sockets 108", 109a" and 109b" of an installation socket portion 107" of the main substrate 105 are correspondingly changed.

Hereinafter, a process for coupling the first and second CI modules 101 and 103 to the multi connector 100 according to an exemplary embodiment will be described with reference to FIGS. 1 and 2.

First, a user inserts the first to third contact points 166, 168 and 169 of the pin portion 165 into the first to third installation sockets 108, 109a and 109b of the installation socket portion 107 to mount the multi connector 100 on the main substrate 105 of the display apparatus 200.

If the first CI module 101 having 64 connection terminal sockets that satisfy the first CI standard needs to be installed in the display apparatus 200, a user inserts the first CI module 101 into the first rectangular parallelepiped-shaped hollow portion 113a of the first slot portion 113 to couple the first connection terminals 155 of the first rectangular parallelepiped-shaped hollow portion 113a to the first connection terminal sockets of the first CI module 101.

If the first connection terminals 155 are coupled to the first connection terminal sockets of the first CI module 101, the first connection terminals 155 become electrically connected to the first contact points 166 through the first sub wiring 176a of the first wiring 176 and thus the first connection terminal sockets of the first CI module 101 become electrically connected to the first installation socket 108 through the substrate 165.

As the first CI module 101 is guided along a bottom surface of the supporting body portion 111 in the installation space 112, since the supporting body portion 111 has a wider width than a width of the first CI module 101, a user may easily insert the first CI module 101 into the first rectangular parallelepiped-shaped hollow portion 113a of the first slot portion 113.

Since the first slot portion 113 into which the first CI module 101 is inserted is formed to have a narrow width on the bottom surface of the supporting body portion 111 and is exposed to the outside by forming a staircase-shaped step together with the second slot portion 115, a user may easily recognize that the CI module inserted into the first slot portion 113 is the first CI module 101 when checking the installation of the first CI module 101 later.

If the first CI module 101 is inserted into the first slot portion 113 as above, the coupling process of the first CI module 101 to the multi connector 100 is completed.

If the second CI module 103 having 132 connection terminal sockets that satisfy the second CI standard needs to be installed in the display apparatus 200, a user inserts the second CI module 103 into the second rectangular parallelepiped-shaped hollow portion 115a of the second slot portion 115 to couple the second connection terminals 157 of the second rectangular parallelepiped-shaped hollow portion 115a to the second connection terminal sockets of the second CI module 103, instead of inserting the first CI module 101 into the first slot portion 113 as explained above.

If the second connection terminals 157 are coupled to the second connection terminal sockets of the second CI module 103, the part 157a of the second connection terminals 157 becomes connected to the first contact points 166 through the second sub wiring 176b of the first wiring 176 and the remainder 157b of the second connection terminals 157 becomes electrically connected to the second and third contact points 168 and 169 of the pin portion 165 through the third and fourth sub wirings 178a and 178b of the second wirings 178, and thus the second connection terminal sockets of the second CI module 103 become electrically connected to the first to third installation sockets 108, 109a and 109b through the substrate 165.

Since the second CI module 103 is guided along an upper surface of the first slot portion 113 and an open top portion of the installation space 112 of the supporting body portion 111, a user may easily insert the second CI module 103 into the second rectangular parallelepiped-shaped hollow portion 115*a* of the second slot portion 115.

Since the second slot portion 115 into which the second CI module 103 is inserted is formed in a wider width than the first slot portion 113, a user may easily recognize that the CI module inserted into the second slot portion 115 is the second CI module 103.

As explained above, in the multi connector 100, the wiring method thereof and the display apparatus 200 having the same according to exemplary embodiments, since the second slot portion 115 for accommodating and supporting the front end portion of the second CI module 103 is provided above the first slot portion 113 for accommodating and supporting the front end portion of the first CI module 101, the installation space for the first and second CI modules 101 and 103 is significantly reduced, compared to the conventional case where the first and second CI modules 101 and 103 are installed through separate connectors. As a result, the main substrate 105 of the display apparatus 200 may be downsized and manufacturing costs may be reduced accordingly.

Since the first and second connection terminals 155 and 157 that are configured to be inserted into the first and second connection terminal sockets of the first and second CI modules 101 and 103 are formed on the front surface 151 of the substrate 151, the substrate 151 may be formed as a single body. As a result, manufacturing costs may be reduced compared to the conventional case where the first and second connection terminals are provided in individual substrates, respectively, for the first and second CI modules.

Since the first and second CI modules 101 and 103 are guided along the bottom surface of the supporting body portion 111 and the upper surface of the second slot portion 115, respectively, in the open installation space 112 of the supporting body portion 111 when the first and second CI modules 101 and 103 are inserted into the first and second slot portions 113 and 115, the first and second CI modules 101 and 103 may be easily inserted into the first and second slot portions 113 and 115.

The first and second slot portions 113 and 115 into which the first and second CI modules 101 and 103 are inserted may be formed to have different widths and may form the staircase-shaped step, and as a result, a user may easily recognize that the CI module inserted into the first slot portion 113 or the second slot portion 115 is the first CI module 101 or the second CI module 103.

Although a few exemplary embodiments have been shown and described, it will be appreciated by those skilled in the art that changes may be made in these exemplary embodiments without departing from the principles and spirit of the invention, the range of which is defined in the appended claims and their equivalents.

What is claimed is:

1. A multi connector comprising:
    a body portion comprising a first slot portion and a second slot portion;
    a substrate portion comprising a substrate having a first surface;
    a plurality of first connection terminals provided on the first surface and extending to an inside of the first slot portion; and
    a plurality of second connection terminals provided on the first surface and extending to an inside of the second slot portion,
    wherein the substrate portion further comprises a pin portion configured to be formed on the substrate and comprising a plurality of first contact points jointly connected to the plurality of first connection terminals and a part of the plurality of second connection terminals and a plurality of second and third contact points connected to a remainder of the plurality of second connection terminals other than the part of the plurality of second connection terminals.

2. The multi connector of claim 1, wherein the second slot portion is provided above the first slot portion.

3. The multi connector of claim 2, wherein the second slot portion forms a step in the form of a staircase, together with the first slot portion.

4. The multi connector of claim 2, wherein the first connection terminals are longer in length than the second connection terminals.

5. The multi connector of claim 1, wherein the first and second connection terminals comprise protruding pins, respectively.

6. The multi connector of claim 1, wherein the first and second connection terminals are provided in different quantities.

7. The multi connector of claim 6, wherein the first connection terminals are fewer in number than the second connection terminals.

8. The multi connector of claim 1, wherein the substrate portion further comprises a printed circuit board (PCB).

9. The multi connector of claim 1, wherein the pin portion is configured to be formed in the substrate and to be coupled to an installation socket portion of a main substrate of an electronic apparatus.

10. The multi connector of claim 9, wherein the
    plurality of first contact points are configured to be jointly connected to the plurality of first connection terminals and the part of the plurality of second connection terminals through a plurality of first wirings; and
    the plurality of second and third contact points are configured to be connected to the remainder of the plurality of second connection terminals other than the part of the plurality of second connection terminals through a plurality of second wirings.

11. The multi connector of claim 10, wherein the first and second contact points are provided in parallel with the first and second connection terminals.

12. The multi connector of claim 10, wherein the first contact points are provided on a central portion of a surface of the pin portion, and the second and third contact points are provided on opposite ends of the central portion of the surface.

13. The multi connector of claim 10, wherein the first contact points are provided on a first side of a surface of the pin portion, and the second and third contact points are provided on a second side of the surface of the pin portion.

14. The multi connector of claim 10, wherein the first contact points are provided on a first surface of the pin portion, and the second and third contact points are provided on a second surface of the pin portion.

15. The multi connector of claim 10, wherein the plurality of first and second wirings are formed in a crossed fashion on the substrate.

16. A multi connector comprising:
    a body portion comprising a first slot portion and a second slot portion; and a substrate portion comprising:
- a substrate comprising a plurality of first connection terminals extending to an inside of the first slot portion and a plurality of second connection terminals extending to an inside of the second slot portion, and
- a pin portion configured to be formed on the substrate and comprising a plurality of first contact points jointly connected to the plurality of first connection terminals and a part of the plurality of second connection terminals and a plurality of second and third contact points connected to a remainder of the plurality of second connection terminals other than the part of the plurality of second connection terminals.

17. The multi connector of claim 16, wherein the substrate further comprises:
- a plurality of first wirings configured to jointly connect the plurality of first connection terminals and the part of the plurality of second connection terminals to the plurality of first contact points; and
- a plurality of second wirings configured to connect the remainder of the plurality of second connection terminals to the plurality of second and third contact points.

18. The multi connector of claim 17, wherein the first contact points are provided on a central portion of a surface of the pin portion, and the second and third contact points are provided on opposite ends of the central portion of the surface.

19. The multi connector of claim 17, wherein the first contact points are provided on a first side of a surface of the pin portion, and the second and third contact points are provided on a second side of the surface of the pin portion.

20. The multi connector of claim 17, wherein the first contact points are provided on a first surface of the pin portion, and the second and third contact points are provided on a second surface of the pin portion.

21. The multi connector of claim 17, wherein the plurality of first and second wirings is formed in a crossed fashion on the substrate.

22. A multi connector, comprising:
- a body portion;
- a first slot portion provided on a surface of the body portion, the first slot portion having a first width;
- a second slot portion provided on a side of the first slot portion opposite the surface of the body portion, the second slot portion having a second width which is greater than the first width; and
- a substrate portion comprising:
  - a substrate comprising a plurality of first connection terminals extending to an inside of the first slot portion and a plurality of second connection terminals extending to an inside of the second slot portion, and
  - a pin portion configured to be formed on the substrate and comprising a plurality of first contact points jointly connected to the plurality of first connection terminals and a part of the plurality of second connection terminals and a plurality of second and third contact points connected to a remainder of the plurality of second connection terminals other than the part of the plurality of second connection terminals.

23. The multi connector of claim 22, wherein the first width corresponds to a width of a first common interface (CI) module satisfying a first CI standard, and the second width corresponds to a width of a second CI module satisfying a second CI standard.

24. The multi connector of claim 23, wherein the first slot portion is configured to connect to the first CI module comprising 64 connection terminal sockets, and the second slot portion is configured to connect to the second CI module comprising 132 connection terminal sockets.

25. The multi connector of claim 24, wherein:
- the body portion comprises an opening through which the first and second CI modules are to be inserted,
- the first slot portion extends a first distance towards the opening,
- the second slot portion extends a second distance towards the opening, and
- the first distance is less than the second distance.

* * * * *